(12) United States Patent
Luffel et al.

(10) Patent No.: US 7,255,234 B2
(45) Date of Patent: Aug. 14, 2007

(54) LOW PROFILE SUPPORT SYSTEM FOR DEVICE RACK-MOUNTING

(75) Inventors: Robert W Luffel, Greeley, CO (US); David P Jones, Bellvue, CO (US); Curtis C. Ballard, Eaton, CO (US); Nicholas D Thayer, Greeley, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1335 days.

(21) Appl. No.: 10/051,573

(22) Filed: Jan. 17, 2002

(65) Prior Publication Data

US 2002/0063099 A1    May 30, 2002

Related U.S. Application Data

(63) Continuation of application No. 09/556,228, filed on Apr. 24, 2000, now abandoned.

(51) Int. Cl.
*A47F 7/00* (2006.01)
(52) U.S. Cl. ....................................................... 211/26
(58) Field of Classification Search .................. 211/26, 211/189; 312/265.1, 265.4, 223.1; 361/796, 361/797, 752, 753, 825; 174/50, 58
See application file for complete search history.

(56) References Cited

U.S. PATENT DOCUMENTS

| 2,902,166 | A | | 9/1959 | Bahr ............................ 311/189 |
| 3,029,367 | A | | 4/1962 | Tomonoh et al. ............ 317/101 |
| 3,098,177 | A | * | 7/1963 | Bleier et al. ................. 317/101 |
| 3,547,274 | A | * | 12/1970 | Sosinkski ..................... 211/89 |
| 3,943,397 | A | * | 3/1976 | Yancey ........................ 315/317 |
| 4,191,436 | A | | 3/1980 | Cherry ......................... 312/293 |
| 4,336,673 | A | * | 6/1982 | Duchesne et al. ............. 52/27 |
| 4,429,937 | A | * | 2/1984 | Stockmaster ................. 339/65 |
| 4,496,057 | A | | 1/1985 | Zenitani et al. ............... 211/26 |
| 4,600,110 | A | * | 7/1986 | Timor ......................... 211/120 |
| 4,737,888 | A | | 4/1988 | Bodnar et al. .............. 361/427 |
| 4,893,405 | A | * | 1/1990 | Pennington ................... 29/857 |
| 5,129,030 | A | * | 7/1992 | Petrunia ...................... 385/135 |
| 5,390,083 | A | | 2/1995 | Decker et al. .............. 361/796 |
| 5,571,256 | A | | 11/1996 | Good et al. ................... 211/26 |
| 5,593,115 | A | * | 1/1997 | Lewis ........................ 248/68.1 |

(Continued)

FOREIGN PATENT DOCUMENTS

DE            2431788            1/1976

(Continued)

OTHER PUBLICATIONS

European Search Report, Application No. EP 01 30 3639, Dec. 23, 2003, 3 pages.

*Primary Examiner*—David Purol

(57) ABSTRACT

A rack-mount storage system comprises an equipment cabinet that defines at least one device opening therein. A first device sized to be received by the first device opening defines a first mounting pathway therein. The first device has a chassis that is sized to receive at least one component of the first device and that also defines at least a portion of the first mounting pathway. A support spar sized to be received by the first mounting pathway and being sized to engage said equipment cabinet and extend substantially between first and second sides of the equipment cabinet engages the first mounting pathway and the equipment cabinet to support said first device in the equipment cabinet.

8 Claims, 7 Drawing Sheets

U.S. PATENT DOCUMENTS

| | | | |
|---|---|---|---|
| 5,679,924 A | 10/1997 | Young et al. | 174/50 |
| 5,718,341 A | 2/1998 | Robertson | 211/59.2 |
| 5,735,411 A * | 4/1998 | Flamme et al. | 211/26 |
| 5,747,734 A | 5/1998 | Kozlowski et al. | 174/50 |
| 5,788,091 A | 8/1998 | Robertson et al. | 211/59.2 |
| 5,806,417 A | 9/1998 | Whiten et al. | 108/106 |
| 5,825,962 A * | 10/1998 | Walters et al. | 385/135 |
| 5,921,402 A * | 7/1999 | Magenheimer | 211/26 |
| 5,941,621 A | 8/1999 | Boulay et al. | 312/334.4 |
| 5,945,633 A * | 8/1999 | Ott et al. | 174/59 |
| 5,978,472 A * | 11/1999 | Tuvy et al. | 379/399 |
| 6,123,203 A | 9/2000 | Gibbons | 211/26 |
| 6,175,079 B1 * | 1/2001 | Johnston et al. | 174/50 |
| 6,185,092 B1 | 2/2001 | Landrum et al. | 361/683 |
| 6,205,029 B1 * | 3/2001 | Byrne et al. | 361/724 |
| 6,220,456 B1 * | 4/2001 | Jensen et al. | 211/26 |
| 6,363,198 B1 * | 3/2002 | Braga et al. | 385/134 |

FOREIGN PATENT DOCUMENTS

| | | |
|---|---|---|
| DE | 8003772 | 6/1980 |
| GB | 2338024 | 12/1999 |
| JP | 08-019972 | 1/1996 |

* cited by examiner

LOW PROFILE SUPPORT SYSTEM FOR DEVICE RACK-MOUNTING

CROSS-REFERENCE TO RELATED APPLICATION

This is a continuation of U.S. patent application Ser. No. 09/556,228, filed on Apr. 24, 2000 now abandoned, which is hereby incorporated herein by reference for all that it discloses.

FIELD OF INVENTION

This invention relates to rack-mount systems in general and more specifically, to a rack-mount storage system having a low profile device support structure.

BACKGROUND

Different types of rack-mount storage systems exist and are being used to mount single or multiple devices in equipment cabinets. For example, such systems are commonly used in research/laboratory settings to hold various types of test equipment such as signal generators, oscilloscopes, computers, etc.

A typical rack-mount storage system may include an equipment cabinet having a device opening therein and a support structure for supporting devices in that equipment cabinet. Commonly used support structures include shelves or platforms for holding the devices or rail systems for slidably receiving the devices.

On some occasions, the devices may be mounted in the equipment cabinet prior to shipment. Therefore, the support structure must be designed to handle those situations in which a fully configured equipment cabinet is shipped. Stated differently, the support structure and cabinet must provide the structural strength and rigidity required to support the weight of the devices mounted in the equipment cabinet both at rest and during shipment.

Conserving and minimizing vertical height space is an important design criterion for rack-mount storage systems. Often, if not always, the more vertical height that is required to mount a device in an equipment cabinet, the more costly the rack-mount storage system is to the end-user. According to EIA (Electronic Industries Association), the applicable rack-mount standard for measuring vertical height space is ANSI/EIA RS-310-C. Under this standard, vertical height space is allocated in increments of 1.75" for the industry standard 19" rack-mount cabinet for electrical products. Obviously, vertical height space can quickly add up when using this incremental approach.

Partly in an effort to provide for the above-mentioned conditions, a rack-mount storage system has been developed in which a full-width shelf is used to support the weight of the devices. Since the shelf needs to have sufficient thickness to support the weight of the devices both at rest and during shipment, the shelf is usually provided with a substantial thickness which occupies valuable vertical height space. Thus, although rack-mount storage systems of this type do work and are currently being used, the continuing need to conserve valuable vertical height space places significant limitations on such rack-mount storage systems.

In another effort in part to meet the above-mentioned conditions while conserving vertical height space, another rack-mount storage system has been developed. In this second rack-mount storage system, a first, usually half-width device is secured to a secondary component. The secondary component may comprise either a second device or a frame approximating the size of the second device. The secondary component bridges the gap between the mounted first (e.g., half-width) device and the opposite side of the equipment cabinet. The first device and secondary component are fastened to one another and are designed such that together they provide the necessary structural integrity to support the weight of the devices both at rest and during shipment. Although the foregoing arrangement may conserve vertical height space, rack-mount storage systems utilizing this secondary component method are not the most convenient and cost conscious approach. Indeed, this type of rack-mount storage system has numerous drawbacks. For example, by requiring the secondary component when only one device is to be installed, this system is impractical. Second, this rack-mount storage system requires the device chassis and the secondary component to possess sufficient strength to support the weight of the devices both at rest and during shipment. Third, this design requires the fastening method to possess significant structural strength. Fourth, this rack-mount storage system requires the first device to be unfastened from the secondary component, a rather cumbersome process, whenever a device is to be removed or installed. All of these drawbacks lead to increased costs and decreased convenience.

Consequently, a need exists for a rack-mount storage system having sufficient strength and rigidity to support the weight of a device or devices both at rest and during shipment. Ideally, the rack-mount storage system would support the device or devices mounted in the equipment cabinet yet require no additional vertical height space for structural support. If achieved, a shorter equipment cabinet might be selected which could not otherwise be used if additional vertical height space were necessary to mount the devices in that equipment cabinet. Alternatively, additional space might be available for mounting other devices in the equipment cabinet.

SUMMARY OF THE INVENTION

A rack-mount storage system according to one embodiment of the present invention may comprise an equipment cabinet that defines at least one device opening therein. A first device sized to be received by the first device opening defines a first mounting pathway therein. The first device has a chassis that is sized to receive at least one component of the first device and that also defines at least a portion of the first mounting pathway. A support spar sized to be received by the first mounting pathway and being sized to engage said equipment cabinet and extend substantially between first and second sides of the equipment cabinet engages the first mounting pathway and the equipment cabinet to support said first device in the equipment cabinet.

BRIEF DESCRIPTION OF THE DRAWING

Illustrative and presently preferred embodiments of the invention are shown in the accompanying drawing in which.

DETAILED DESCRIPTION OF THE INVENTION

Figure 1:
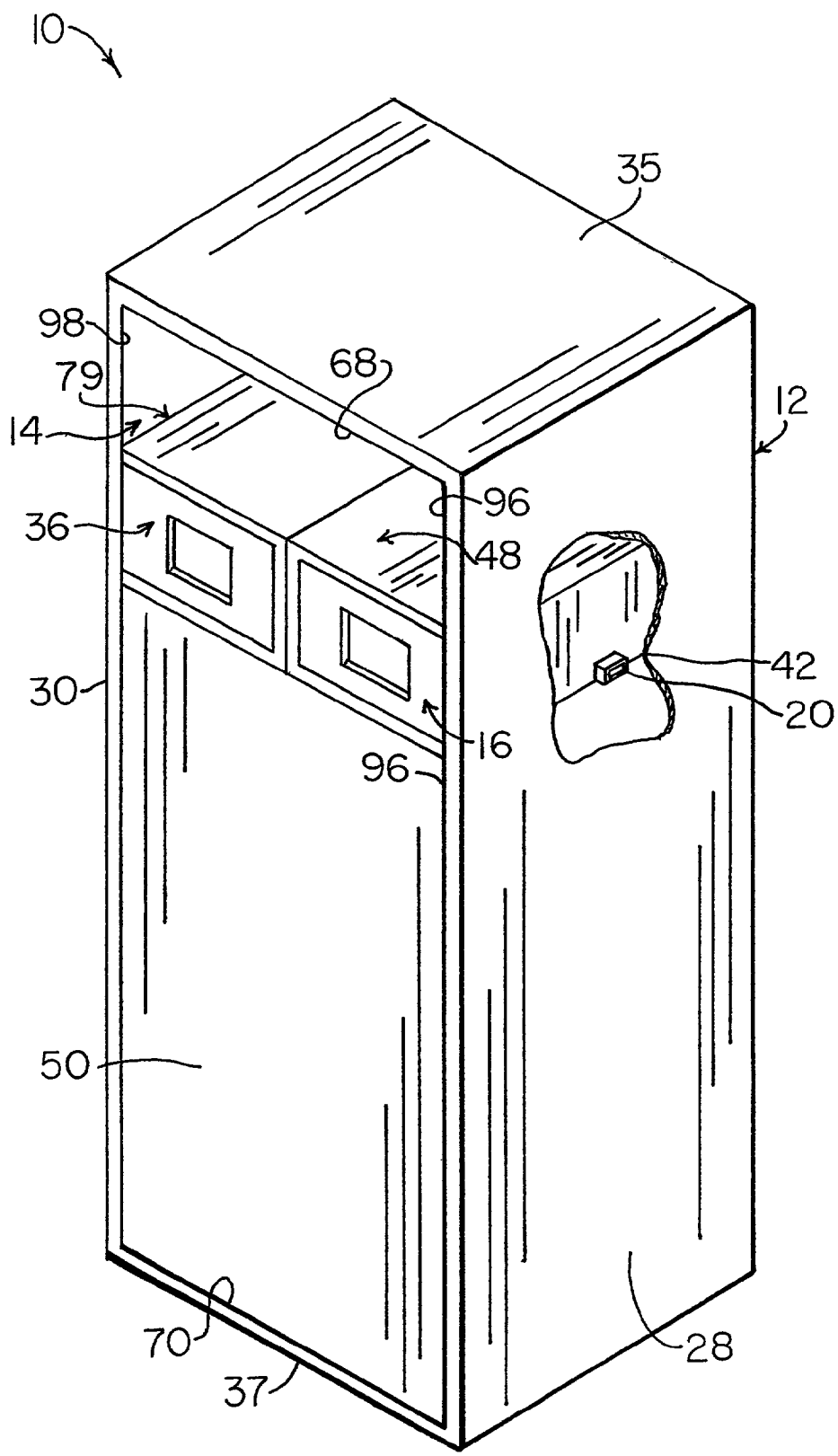
FIG. 1 is a perspective view of the rack-mount storage system according to the invention.

A rack-mount storage system 10 according to one preferred embodiment of the present invention is shown in FIG. 1 and may comprise an equipment cabinet 12 sized to receive one or more components or devices 16 and 36. The devices 16 and 36 are supported within the equipment cabinet 12 by a support spar 20 that extends between the first and second sides 28, 30 of the equipment cabinet 12. Each of the devices 16, 36 is provided with a respective mounting pathway 18, 38 (FIGS. 2 and 6) therein that is sized to receive the support spar 20. Since the support spar 20 is carried within the first and second mounting pathways 18, 38, and since the first and second mounting pathways 18, 38 are recessed within their respective devices 16, 36, the support spar 20 supports the first and second devices 16, 36 within the equipment cabinet 12 without adding additional height to either device 16 or 36. That is, the arrangement is such that the support spar 20 does not extend downwardly beyond the bottom surfaces 24 and 82 of the respective devices 16 and 36.

Figure 2:
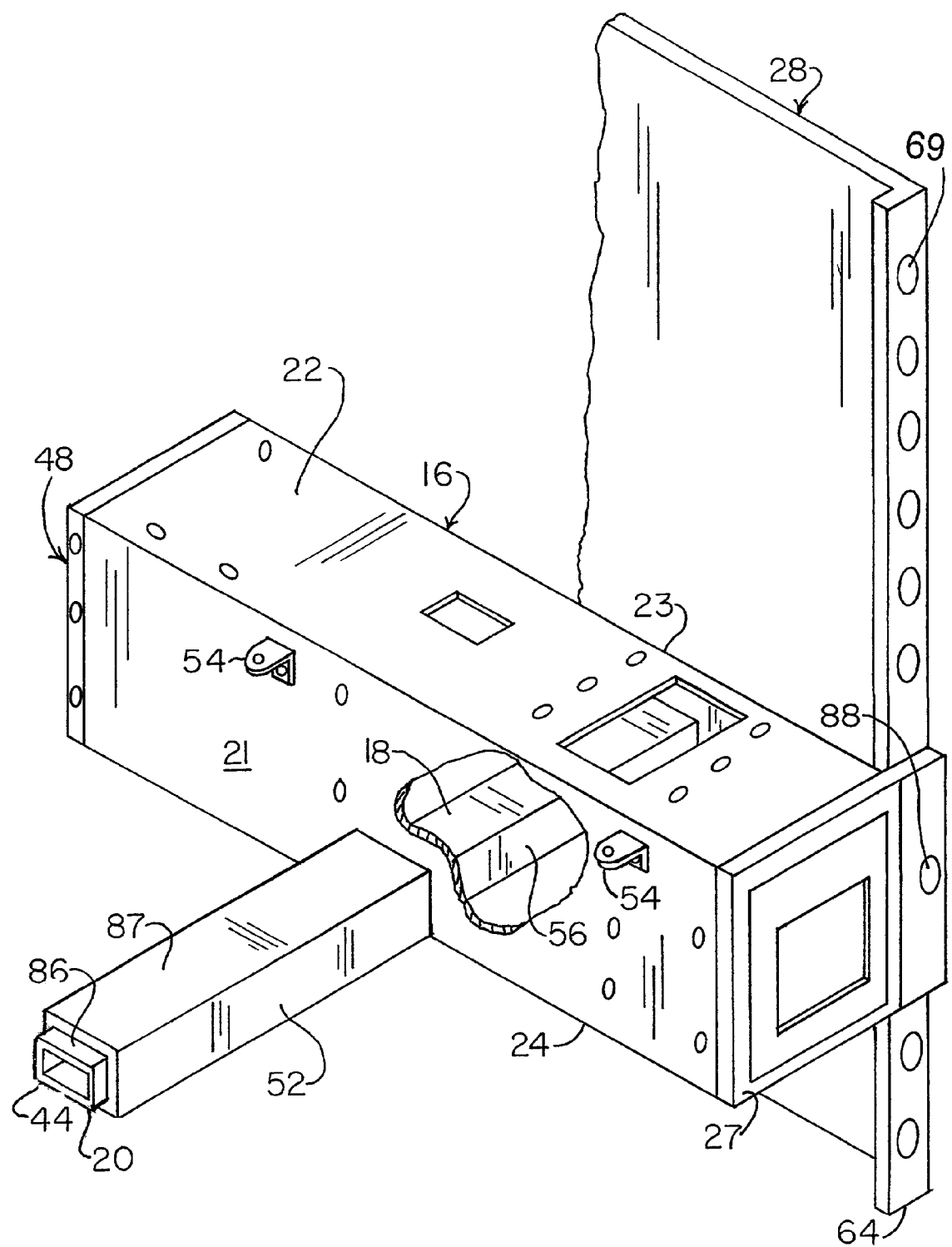
FIG. 2 is a perspective view showing the support spar engaged with the mounting pathway in the device.

With reference now primarily to FIG. 2, the first device 16 utilized in one preferred embodiment of the present invention may comprise a tape autochanger device of the type known in the art, although other devices may also be used. Regardless of the particular function of the device 16, device 16 may be provided with a housing or chassis 48 suitable for holding the various systems and components (not shown) that may be contained within the first device 16. By way of example, in the embodiment shown and described herein, the chassis 48 comprises a generally rectangularly shaped structure having a top surface 22, a bottom surface 24 and two opposed sides or surfaces 21 and 23. The first device 16 may also be provided with a front panel or escutcheon 27 which may be fastened to the equipment cabinet 12 in the manner that will be described in greater detail below. The chassis 48 may also be provided with a first channel member 56 therein which, together with the bottom surface 24 of the chassis 48, defines the first mounting pathway 18. The first mounting pathway 18 may comprise a generally rectangular cross-section, although other shapes are possible.

The support spar 20 may comprise an elongate member sized to be received by the first mounting pathway 18 provided in the first device 16. The support spar 20 has a length 40 (FIG. 4) that is sufficient to allow the support spar 20 to extend substantially between the first and second sides 28, 30 of the equipment cabinet 12. For example, in the embodiment shown and described herein, the support spar 20 extends between first and second mounting rails 32 (FIG. 5) and 34 (FIGS. 3 and 5) which are affixed to the first and second sides 28, 30, respectively, of the equipment cabinet 12. See FIG. 5. Thus, the device 16 is directly supported on the one side by the first mounting rail 32 and on the other side by the spar 20 and, ultimately, by the second mounting rail 34, as is best seen in FIG. 5.

Referring back now to FIG. 1, the equipment cabinet 12 may be provided with a second device 36 that is sized to fit between the first device 16 and the second side 98 of the device opening 14 defined by the equipment cabinet 12, although such a second device 36 is not required. By way of example only, the second devices 36 also may comprise a tape autochanger, although other devices could also be used. If such a second device 36 is to be provided, it is also supported by the support spar 20 by way of the engagement of the support spar 20 with the second mounting pathway 38 provided in the second device 36. Alternatively, and as will be described in greater detail below, if such a second device 36 is not provided, a spacer sleeve 52 may be positioned over the support spar 20 to assist in holding the first device 16 against the first mounting rail 32. See FIGS. 2 and 3.

Figure 3:
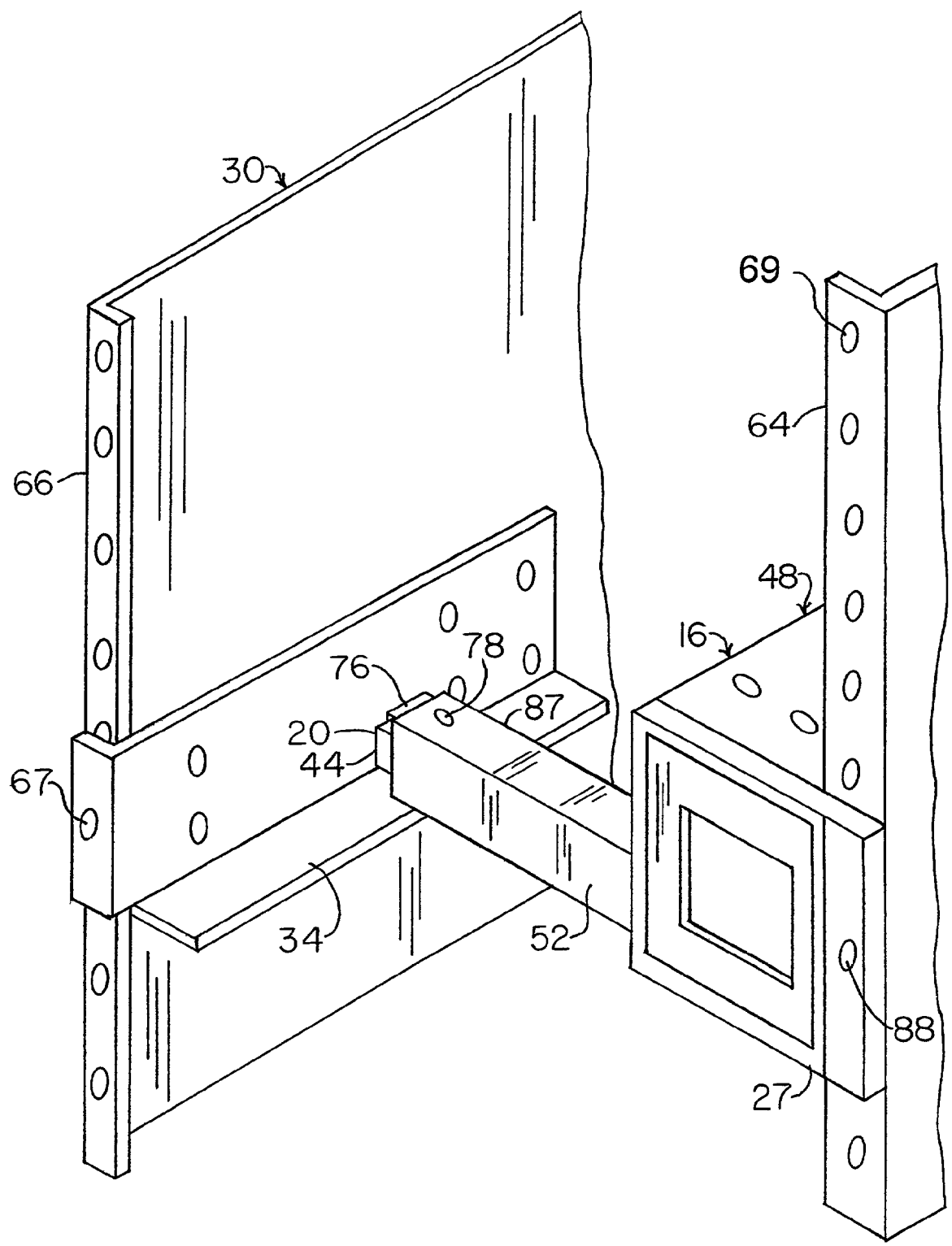
FIG. 3 is a perspective view showing the engagement of the support spar and spacer sleeve with a mounting rail provided on the equipment cabinet.

The device 16 may be mounted within the equipment cabinet 12 by first sliding the support spar 20 through the first mounting pathway 18 of the first device 16 and, optionally, the spacer sleeve 52. With the support spar 20 and optional spacer sleeve 52 in place, the assembly may be inserted into the opening 14 in the equipment cabinet 12 so that the first device 16 and the spacer sleeve 52 rest upon the first and second mounting rails 32 and 34 provided in the equipment cabinet 12. The arrangement is such that the device 16 is supported on the one side by mounting rail 32 and on the other side by the support spar 20 and mounting rail 34, as best seen in FIG. 5. The support spar 20 may be vertically constrained (i.e., held against) the first and second mounting rails 32, 34 by side tabs 76 which may be provided on the first and second mounting rails 32, 34. optionally a pair of fasteners 78 may be used to secure the spar 20 to the rails 32, 34. The first device 16 may be further secured to the equipment cabinet 12 by attaching the first front panel 27 of the first device 16 to the first flange section 64 with the fastener 88 (FIGS. 2, 3 and 5).

Removing the single device 16 is equally convenient. As a first step in the removal process, a user (not shown) would first remove the fastener 88 from the front panel 27 of device 16, if such a fastener 88 is used. Removal of the fastener 88 disengages the front panel 27 from the first flange section 64 of cabinet side 28. The user would then remove the fasteners 78 (if fasteners 78 are used) to free the spar 20 from the mounting rails 32 and 34. The assembly may then be removed from the equipment cabinet 12 by sliding the entire assembly outwardly from the opening 14. Lastly, the support spar 20 may be removed from the first mounting pathway 18 and the spacer sleeve 52. Because the present invention does not require any other components for mounting the first device 16 within the equipment cabinet 12, the cumbersome process of fastening/unfastening the first device 16 and any other secondary components is avoided.

Figure 5:
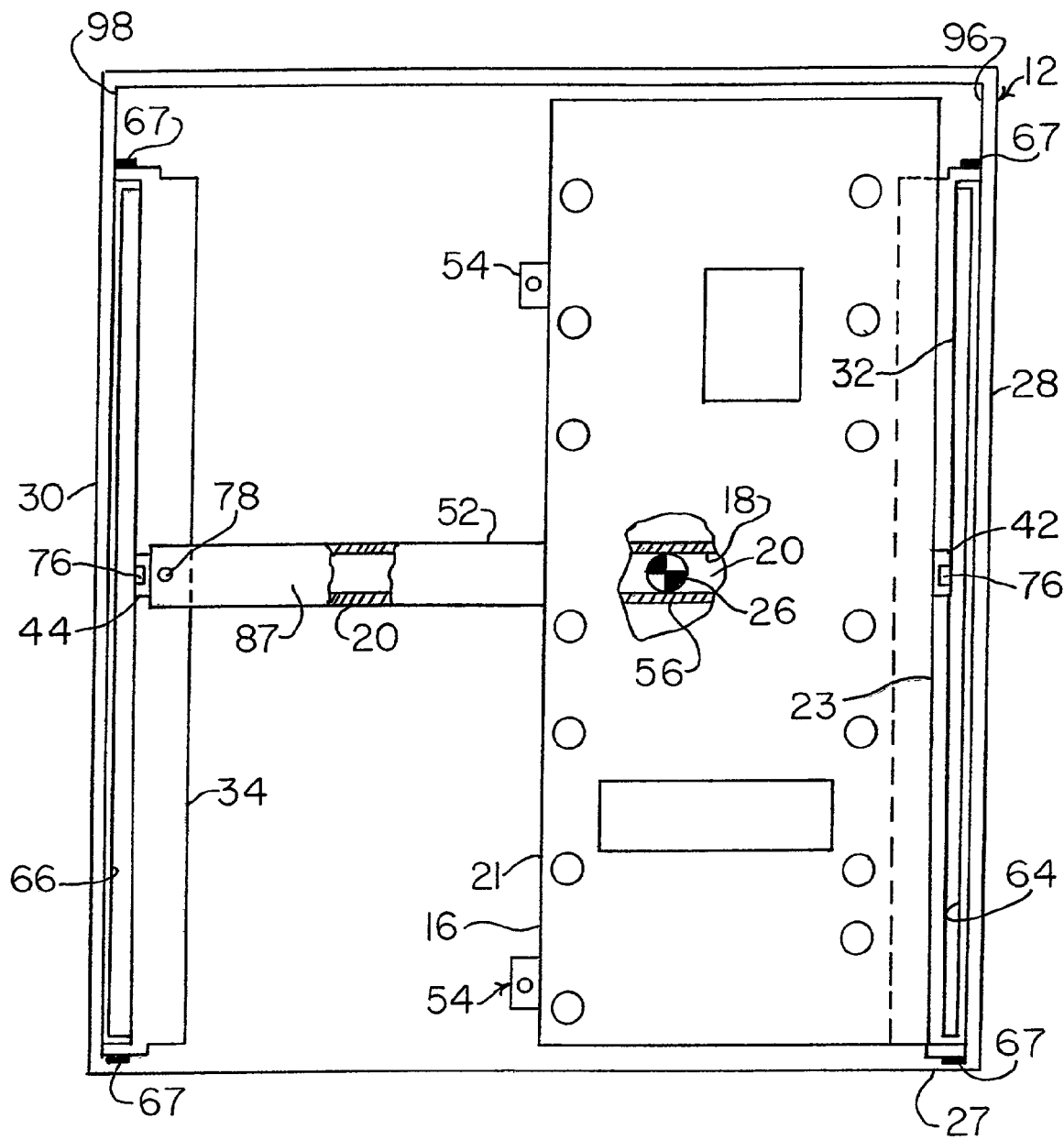
FIG. 5 is an overhead plan view of the rack-mount storage system with the top of the equipment cabinet removed to show the arrangement of the device and support spar.
Figure 6:
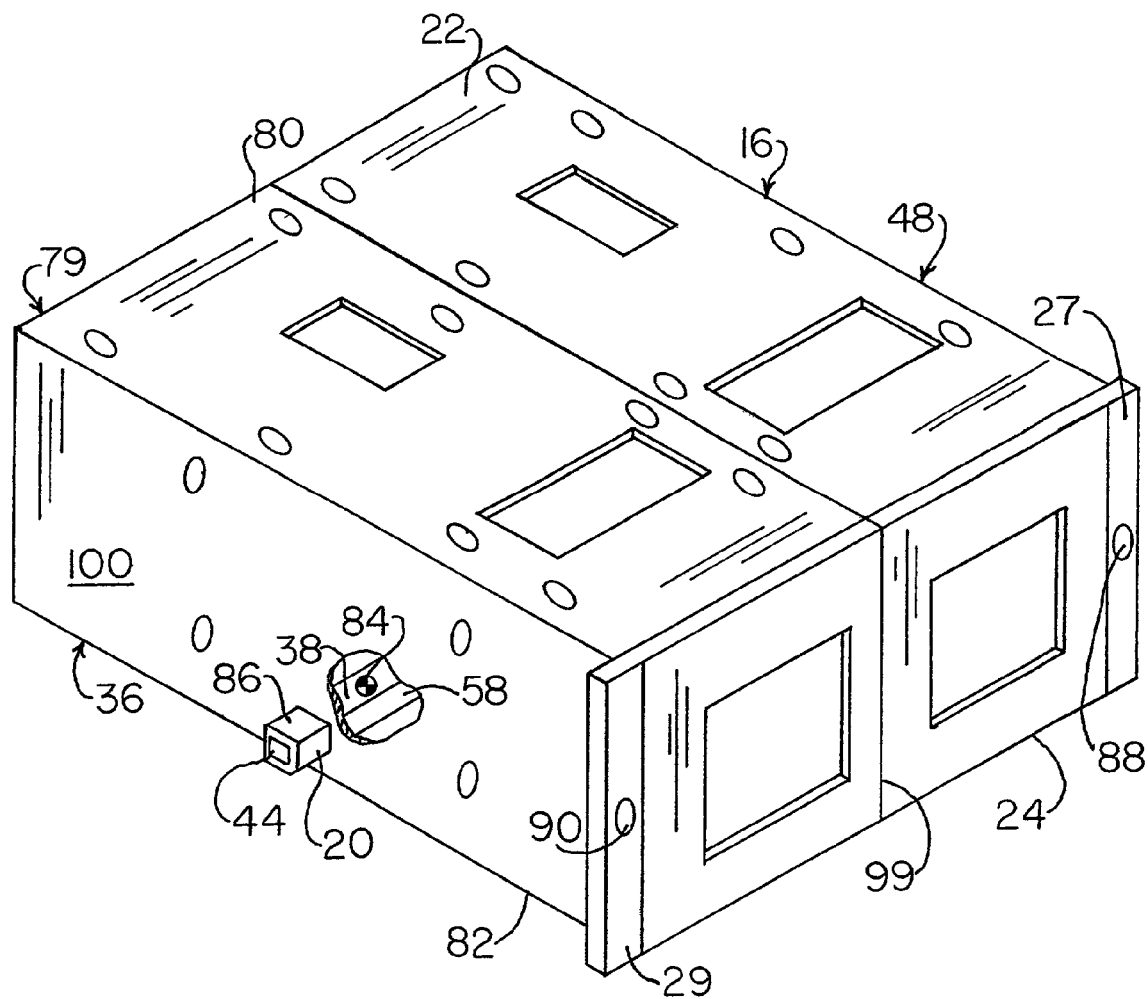
FIG. 6 is a perspective view showing two devices connected together and the support spar extending through both devices.

The present invention also offers easy installation of multiple devices in the equipment cabinet 12. For example, when two devices 16 and 36 are to be mounted in the opening 14 provided in the equipment cabinet 12, the support spar 20 is first inserted through the first and second mounting pathways 18, 38 of the first and second devices 16, 36, respectively. With the support spar 20 in place, the first and second devices 16, 36 are inserted into the opening 14 in equipment cabinet 12, ultimately resting on the first and second mounting rails 32 and 34 attached to the sides 28 and 30 of equipment cabinet 12. When properly positioned within the equipment cabinet 12, the support spar 20 is vertically constrained (i.e., held in position against the first and second mounting rails 32 and 34) by the side tabs 76 provided on the first and second mounting rails 32 and 34. Optionally, one or more fasteners 78 may be used to secure the support spar 20 to the first and second mounting rails 32 and 34. The first device 16 may be further secured to the equipment cabinet 12 by securing the front panel 27 of the first device 16 to the first flange section 64 of side 28 with the fastener 88 (FIGS. 2, 3 and 5). Likewise, the second device 36 may be further secured to the equipment cabinet 12 by securing the front panel 29 of the second device 36 to the second flange section 66 of side 30 with a fastener 90 (FIG. 6).

Removal of multiple devices (e.g., 16, 36) is equally convenient in that it first involves disengaging the first and second front panels 27, 29 from the first and second flange sections 64, 66, respectively, removing the fasteners 78 (if used), and by sliding the support spar 20 horizontally from under the side tabs 76. Next, the first and second devices 16, 36 may be removed from the equipment cabinet 12. The support spar 20 may be removed from the first mounting pathway 18 and the second mounting pathway 38 if necessary.

A significant advantage of the present invention is that the support spar 20 supports the first and second devices 16 and 36 within the equipment cabinet 12 without requiring any additional height. Thus, the amount of vertical height space that is needed to mount a device in the equipment cabinet 12 is determined by the height of the device only and not by the support structure. This important design feature of the present invention may allow a shorter equipment cabinet to be selected which could not otherwise be used if additional vertical height space were necessary to mount devices in that equipment cabinet. Alternatively, the additional vertical height space may be used to mount devices in the equipment cabinet.

Another advantage of the present invention is the ease with which a single or multiple devices can be installed or removed from the equipment cabinet 12. The present invention uses a minimal number of parts to provide the necessary structural support for mounting the devices. By using fewer parts, the process of installing and removing the devices is greatly simplified and much more convenient than designs requiring a greater number of parts.

Still yet another advantage of the present invention is that it requires less structural rigidity of the chassis of the device or devices because the support spar 20 provides the necessary structural support for the device or devices. Moreover, the present invention also allows for the later installation of additional devices when only a single device is mounted in the equipment cabinet 12, thereby providing a level of convenience not previously realized.

Having briefly described the rack-mount storage system 10, as well as some of its more significant features and advantages, the various embodiments of the rack-mount storage system according to the present invention will now be described in detail. However, before proceeding with the description, it should be noted that while the rack-mount storage system 10 is shown and described herein as it could be used to support one or two "half-width" devices (e.g., 16, 36) within the equipment cabinet 12, it could also be used to support a single, less than full-width device (not shown). In still another application, full-width devices (not shown) could also be supported. Of course, the rack-mount storage system 10 could also be used to support several devices in a vertical (i.e., stacked) arrangement in the equipment cabinet 12, as would be obvious to persons having ordinary skill in the art after having become familiar with the details of the present invention. Moreover, it should be noted that while the present invention is shown and described herein as it could be used in conjunction with a standard EIA rack-mount cabinet, other types of cabinets may also be used. Accordingly, the present invention should not be regarded as limited to the particular components and configurations shown and described herein.

With the foregoing considerations in mind, the rack-mount storage system 10 according to one preferred embodiment of the present invention is shown in FIG. 1 and may include an equipment cabinet 12 having a device opening 14 therein that is sized to receive one or more devices (e.g., devices 16, 36). The equipment cabinet 12 may comprise a top side 35 and a bottom side 37. The equipment cabinet may further include a first side 28 and a second side 30 which support spar 20 engages to support one or more devices within the device opening 14. The first side 28 may be provided with a first flange section 64 (FIGS. 2, 3 and 5). Similarly, the second side 30 may be provided with a second flange section 66 (FIGS. 3 and 5). The first side 28 may also include a first mounting rail 32 (FIG. 5) affixed to the first side 28 of the equipment cabinet 12. Likewise, the second side 30 may include a second mounting rail 34 (FIGS. 3 and 5) affixed to the second side 30 of the equipment cabinet 12. The first and second mounting rails 32, 34 may be affixed to the first and second sides 28, 30, respectively, by securing the first and second mounting rails 32, 34 to the first and second flange sections 64, 66, respectively, with a suitable fastener 67, such as screws, rivets, adhesives, formed tabs and hooks, brackets, etc.

Each of the first and second mounting rails 32, 34 may be provided with a side tab 76 that captures the top surface 86 of the support spar 20 (FIGS. 3 and 5). By capturing the top surface 86 of the support spar 20, the side tabs 76 prevent the support spar 20 from moving upwardly away from the first and second mounting rails 32, 34. That is, the side tabs 76 vertically constrain the spar 20.

With reference to FIG. 1, the device opening 14 may comprise top, bottom, first, and second sides 68, 70, 96, and 98, respectively, which, in the embodiment shown and described herein, may comprise the interior sides or surfaces of the top, bottom, first, and second sides 35, 37, 28, 30, respectively, of the equipment cabinet 12. The first and second sides 96, 98 of device opening 14 are separated by a spaced distance that is greater than, or at least equal to, the width of a first device 16. Similarly, the top and bottom sides 68 and 70 of device opening 14 are separated by a spaced distance that is greater than, or at least equal to, the height of the first device 16.

The equipment cabinet 12 may also be provided with one or more front panels, such as front panel 50 to improve the overall appearance and aesthetic value of the equipment cabinet 12. The front panel 50 may be sized to extend between the first and second sides 96, 98 of the device opening 14 (or a device (e.g. 16) and the second side 98 of the device opening 14) and between the device or devices (e.g. 16, 36) and the bottom side 70 or top side 68 defining the device opening 14, as the case may be.

The various sides 28, 30, 35 and 37 of the equipment cabinet 12 as well as the front panel 50 may be made from any of a wide range of materials suitable for the intended application, such as metal, wood or plastic. By way of example, in the embodiment shown and described herein, the various sides 28, 30, 35, 37 and the front panel 50 are formed from sheet metal. Alternatively, other materials and/or forming techniques may be used, as would be obvious to persons having ordinary skill in the art after having become familiar with the teaching of the present invention.

The first and second flange sections 64, 66 may comprise any of a wide variety of configurations suitable for the intended application. By way of example, in one preferred embodiment, the first and second flange sections 64, 66 comprise integral portions of the first and second sides 28, 30, respectively, and are formed from sheet metal. The first and second flange sections 64 and 66 may be provided with a plurality of holes 69 therein to allow the front panel(s) (e.g., 27, 29) of the device(s) (e.g., 16, 36) to be secured thereto.

Similarly, the first and second mounting rails 32, 34 and the side tab 76 may also be designed in various ways and made from any wide range of materials, such as metal or plastic, suitable for the intended application. In the embodiment shown and described herein, the first and second mounting rails 32, 34 are formed from sheet metal. The side tabs 76 comprise integral portions of the first and second side rails 32, 34 and may be formed in accordance with any of a wide variety of processes well-known in the art for providing integral tabs to sheet metal members.

With reference now primarily to FIG. 2, the first device 16 may be provided with a chassis 48 suitable for holding the various systems and components (not shown) that may be contained within the first device 16. In the embodiment shown and discussed herein, the chassis 48 comprises a generally rectangularly shaped structure having a top surface 22, a bottom surface 24 and two opposed sides or surfaces 21 and 23. Alternatively, of course, other configurations are possible.

The first device 16 may also be provided with an escutcheon or first front panel 27 which may be fastened to the equipment cabinet 12 by securing the first front panel 27 to the first flange section 64 with a suitable fastener 88 (FIGS. 2, 3 and 5) (e.g., screws, rivets, adhesives, formed tabs and hooks, brackets, etc.).

The chassis 48 of the first device 16 may be provided with a first channel member 56 therein (FIGS. 2 and 5) which, together with the bottom surface of the 24 of the chassis 48, defines a first mounting pathway 18. The first mounting pathway 18 is sized to slidably receive the support spar 20. Since the first mounting pathway 18 is contained within the chassis 48 of device 16, the support spar 20 does not extend downwardly beyond the bottom surface 24 of the chassis 48.

It is generally preferred, but not required, that the channel member 56 which defines the pathway 18 be located at about the same fore-to-aft position as the fore-to-aft center of gravity 26 of the first device 16 (FIG. 5). So locating the pathway 18 at about the same fore-to-aft position as the center of gravity 26 minimizes the torsional (i.e. twisting) loads on the chassis 48 and allows a single support spar 20 to support the device 16.

In the embodiment shown and described herein, the first channel member 56 comprises a continuous member having a cross-section in the shape of an inverted "U," although other cross-sectional configurations are possible, as would be obvious to persons having ordinary skill in the art after having become familiar with the teachings of the present invention. The first channel member 56 is attached to or mounted within the chassis 48 of device 16 so that the channel member 56, along with the bottom surface 24 of device 16 defines the first pathway 18. Since, in the embodiment shown and described herein, the channel member 56 has a cross-section in the shape of an inverted "U," the pathway 18 defined by the channel member 56 and the bottom surface 24 of chassis 48 comprises a generally rectangularly shaped opening.

While the first channel member 56 utilized in one preferred embodiment comprises a single, substantially continuous member, other configurations are possible. For example, in another embodiment, the channel member 56 could comprise two or more separate pieces that are mounted to the chassis 48 in the manner already described. In still another embodiment, the channel member 56 is eliminated, in which case the pathway 18 is defined by openings provided in the opposed sides 21 and 23 of the chassis 48 that are sized to receive the support spar 20.

The first channel member 56 may be made from any of a wide range of materials, such as metals or plastics, suitable for the intended application. In one preferred embodiment, the first channel member 56 is fabricated from sheet metal. Of course, the particular configuration of the first channel member 56 will be dictated by the material comprising the chassis for and the weight of the devices to be supported.

Figure 4:
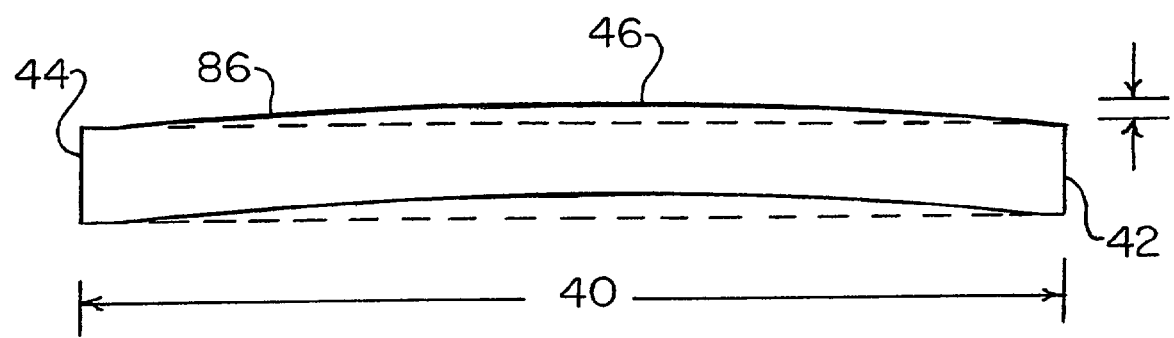
FIG. 4 is a side view of the curved support spar.

The support spar 20 is best seen in FIGS. 2 and 4 and may comprise an elongate member sized to be received by the first mounting pathway 18 provided in the first device 16. The support spar 20 has a length 40 (FIG. 4) that is sufficient to allow the support spar 20 to extend between the first and second sides 28 and 30 of the equipment cabinet 12 (FIG. 5). More specifically, in the embodiment shown and described herein, the length 40 of the support spar 20 is sufficient such that the first and second ends 42, 44 of the support spar 20 extend between the first and second mounting rails 32 (FIG. 5) and 34 (FIGS. 3 and 5) affixed to the first and second sides 28, 30, respectively, of the equipment cabinet 12. The arrangement is such that the device 16 is supported on the one side directly by the first mounting rail 32 and on the other side by the second mounting rail 34 via spar 20.

As shown in FIGS. 3 and 5, the support spar may comprise a top surface 86 such that when the first and second ends 42, 44 of the support spar 20 engage the first and second mounting rails 32, 34, respectively, the top surface 86 is captured by side tabs 76 provided on the first and second mounting rails 32, 34. With the top surface 86 captured by the side tabs 76, the first and second ends 42, 44 of the support spar 20 are prevented from moving upwardly away from the first and second mounting rails 32, 34.

It is generally preferred, but not required, to further secure the support spar 20 to the first and second mounting rails 32, 34. For example, in the embodiment shown and described herein, the support spar 20 may be secured to the first and second mounting rails 32, 34 by suitable fasteners 78 (FIG. 3), such as screws, rivets, adhesives, formed tabs and hooks, brackets, etc. With the support spar 20 secured to the first and second mounting rails, 32, 34, the support spar 20 is prevented from moving upwardly away from the first and second mounting rails 32, 34.

The support spar 20 may be made from any of a wide range of materials, such as metals or plastics, suitable for the intended application. The support spar 20 may also be formed with any cross sectional shape that is suitable for the intended application. By way of example only, in one preferred embodiment, the support spar 20 is extruded from aluminum and has a generally rectangular and tubular cross section.

As shown in FIGS. 2, 3 and 5, if only the first device 16 having a width less than the spaced distance between the first and second sides 96, 98 of the device opening 14 is to be mounted in the equipment cabinet 12, a spacer sleeve 52 may be provided on support spar 20 to assist in holding the first device 16 against the first mounting rail 32. In one preferred embodiment, the wall thickness of the spacer sleeve 52 is made to be about equal to the wall thickness of the bottom surface 24 of chassis 48. Since the spacer sleeve 52 extends nearly to the end 44 of support spar 20, the spacer sleeve 52, not the support spar 20, directly contacts the mounting rail 34. Consequently, the spacer sleeve 52 provides the necessary material thickness between the spar 20 and the mounting rail 34 So that the support spar 20 is level within the equipment cabinet 12. Although it is not required, the spacer sleeve 52 may be secured to the second mounting rail 34 by a fastener 78 located at about the upper surface 87 of the spacer sleeve 52 (FIG. 3).

The spacer sleeve 52 may be fabricated from any of a wide range of materials, such as metals or plastics, suitable for the intended application. In the embodiment shown and described herein, the spacer sleeve 52 is fabricated from sheet metal and is sized to be slidably received over the support spar 20.

As best seen in FIG. 1, the equipment cabinet 12 may be provided with a second device 36 sized to fit between the first device 16 and the second side 98 of the device opening 14, although such a second device 36 is not required. The second device 36 may be mounted adjacent the first device 16 SO that the first and second devices 16, 36 extend between the first and second sides 96, 98 of the device opening 14 (FIGS. 1 and 6) and rest on the first and second mounting rails 32, 34, respectively. Of course, the first and second devices 16, 36 may be positioned within the device opening 14 in any other convenient arrangement depending on the requirements of the particular application.

The second device 36 may be similar to the first device 16 and may be provided with a chassis 79 suitable for holding the various systems and components (not shown) that may be contained within the second device 36. In the embodiment shown and discussed herein, the chassis 79 comprises a generally rectangularly shaped structure having a top surface 80, a bottom surface 82, and two opposed sides or surfaces 99 and 100 (FIG. 6). Alternatively, of course, other configurations are possible.

The second device 36 may also be provided with an escutcheon or second front panel 29 which may be fastened to the equipment cabinet 12 by securing the second front panel 29 to the second flange section 66 with a fastener 90 (FIG. 6) (e.g., screws, rivets, adhesives, formed tabs and hooks, brackets, etc.), suitable for the intended application.

The chassis 79 of the second device 36 may be provided with a second channel member 58 therein (FIG. 6) which, together with the bottom surface 82 of the chassis 79, defines a second mounting pathway 38. The second mounting pathway 38 is sized to slidably receive the support spar 20. Since the second mounting pathway 38 is contained within the chassis 79 of device 36, the support spar 20 does not extend downwardly beyond the bottom surface 82 of the chassis 79.

As was the case for the first device 16, it is generally preferred, but not required, to locate the pathway 38 at about the same fore-to-aft position as the fore-to-aft center of gravity 84 of the second device 36 (FIG. 6). So locating the pathway 38 at about the same fore-to-aft position as the center of gravity 84 minimizes the torsional (i.e. twisting) loads on the chassis 79 and allows a single support spar to support both devices 16 and 36.

In the embodiment discussed herein, the second channel member 58 comprises one continuous member having an inverted "U" shaped cross section, although other cross sectional shapes could be used. Also, as was the case for the first channel member 56, the second channel member 58 could comprise two or more separate pieces that are mounted to the chassis 79. Alternatively, a second channel member 58 need not be provided, in which case the mounting pathway 38 may simply be defined by openings provided in the opposed sides 99 and 100 of the chassis 79 that are sized to receive the support spar 20.

The second channel member 58 may be made from any of a wide range of materials, such as metals or plastics, suitable for the intended application. In one preferred embodiment, the second channel member 58 is fabricated from sheet metal. Of course, the particular configuration of the second channel member 58 will be dictated by the material comprising the chassis for and the weight of the devices to be supported.

As best seen in FIG. 6, the second mounting pathway 38 may be substantially aligned with the first mounting pathway 18 when the first and second devices 16, 36 are positioned adjacent one another. When so aligned, the support spar 20 passes through the first and second devices 16, 36 by way of the first and second mounting pathways 18, 38, respectively, with the first and second ends 42, 44 of the support spar 20 extending between the first and second mounting rails 32, 34, respectively. The arrangement allows the weight of the first and second devices 16, 36 (the outboard ends of which rest directly on the first and second mounting rails 32, 34), to be transferred to the equipment cabinet 12 via the support spar 20 and the first and second mounting rails 32, 34.

When devices 16, 36 are mounted adjacent one another, typical alignment specifications require those devices to be aligned to maintain a quality appearance (FIGS. 1 and 6). Due to necessary clearances and tolerances, however, device misalignment may occur.

One method for ensuring the alignment of the devices 16 and 36 is to secure them together. In one preferred embodiment, side 21 of the first device 16 is secured to side 99 of the second device 36 with a fastening device, such as a tab 54 (FIGS. 2 and 5). The fastening device 54 may be selected from any wide range of fastening systems or devices (e.g., screws, rivets, adhesives, formed tabs and hooks, brackets, etc.), suitable for the intended application keeping in mind that because the support spar 20 will support the weight of the devices, the fastener 54 does not require significant structural strength and rigidity. In an alternative embodiment, the support spar 20 is curved (FIG. 4) such that the center 46 of the support spar 20 is higher than its first and second ends 42, 44 when the support spar 20 is engaging the first and second mounting pathways 18, 38. In this alternative embodiment, the support spar 20 compensates for the clearance tolerances by lifting up the first and second devices 16, 36 at about the center 46 of the support spar 20.

Figure 7:
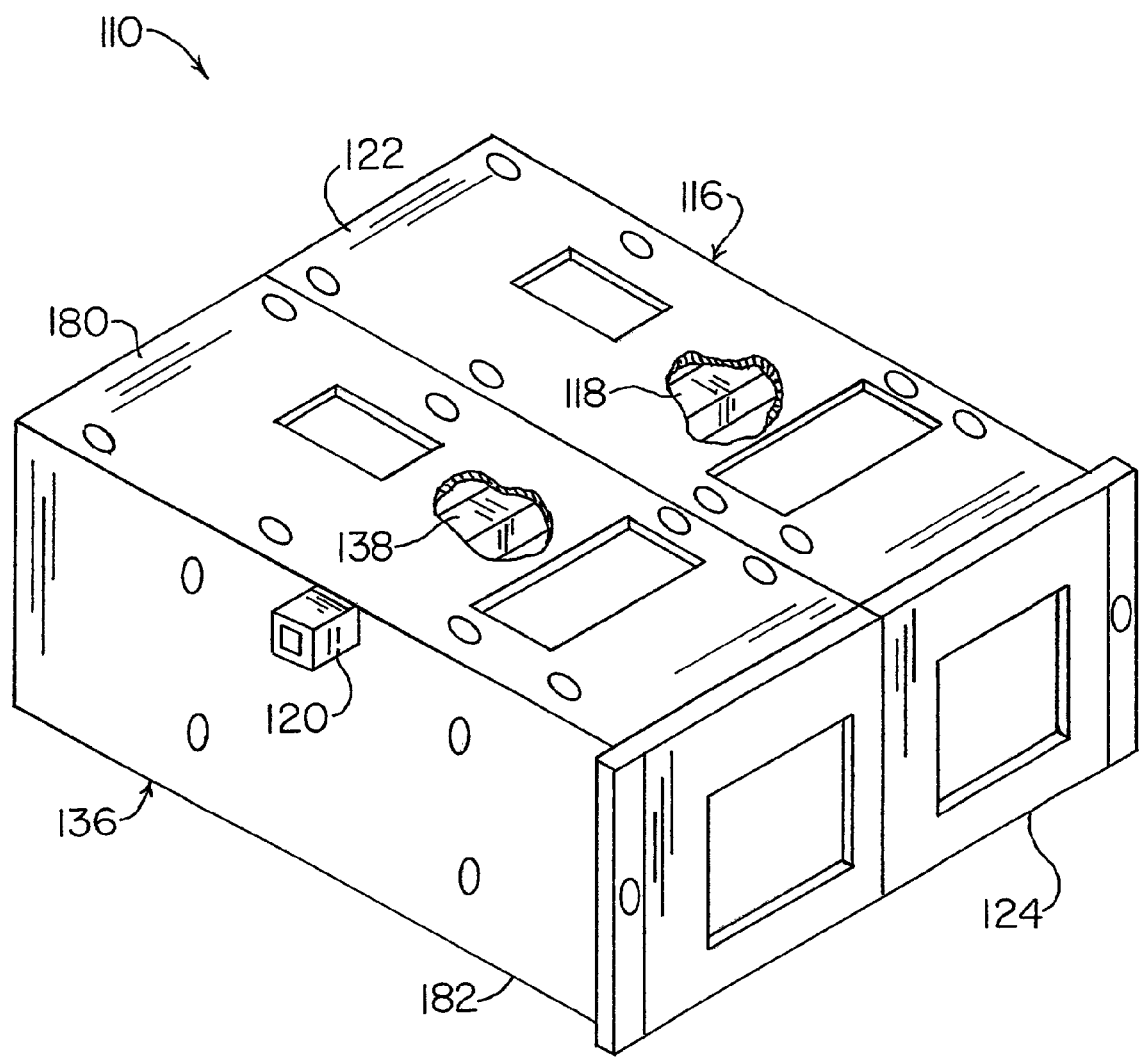
FIG. 7 is a perspective view showing two devices connected together being supported by a support spar located near the top surface of each device.

A second embodiment 110 of the rack-mount storage system according to the present invention is illustrated in FIG. 7 and may include a first device 116 having a top surface 122 and a bottom surface 124 and defining a first mounting pathway 118. The rack-mount storage system 110 may further include a second device 136 having a top surface 180 and a bottom surface 182 and defining a second mounting pathway 138. In this alternative embodiment, the first and second mounting pathways 118, 138 are located adjacent the top surfaces 122, 180, respectively, such that when the support spar 120 is received by the first and second mounting pathways 118, 138 the support spar 120 does not extend upwardly beyond the top surfaces 122 and 180 of the respective devices 116 and 136.

An alternative embodiment that is not shown may include a second support spar sized to be received by the second mounting pathway 38. To support the first and second devices 16, 36, a first support spar (e.g., 20) is first passed through the first device 16 by way of the first mounting pathway 18. The second support spar (not shown) is passed through the second device 36 by way of the second mounting pathway 38. The first support spar (e.g., 20) and the second support spar (not shown) are then secured to one another with a suitable fastener (not shown), such as, for example, screws, rivets, adhesives, formed tabs and hooks, brackets, etc. To support the first and second devices 16, 36 within the equipment cabinet 12, the support spar 20 engages the first mounting rail 32 and the second support spar engages the second mounting rail 34.

It is contemplated that the inventive concepts herein described may be variously otherwise embodied and it is intended that the appended claims be construed to include alternative embodiments of the invention except insofar as limited by the prior art.

What is claimed is:

1. A rack-mount storage system, comprising:
an equipment cabinet having a first side and a second side, said equipment cabinet defining at least one device opening therein;
a first device sized to be received by the device opening, said first device defining a first mounting pathway therein, said first device having a first chassis sized to receive at least one component of said first device, at least a portion of said first chassis defining at least a portion of said first mounting pathway; and
a support spar being sized to be received by the first mounting pathway and being sized to engage said equipment cabinet, said support spar engaging the first mounting pathway and said equipment cabinet, said support spar extending substantially transversely between the first and second sides of said equipment cabinet to support said first device in said equipment cabinet, wherein said first chassis comprises a channel member therein, a top surface and a bottom surface, and wherein the first mounting pathway is defined by said channel member and the bottom surface of said first chassis so that when said support spar is received by the first mounting pathway, said support spar does not extend downwardly beyond the bottom surface of said first chassis.

2. A rack-mount storage system, comprising:
an equipment cabinet having a first side and a second side, said equipment cabinet defining at least one device opening therein;
a first device sized to be received by the device opening, said first device defining a first mounting pathway therein, said first device having a first chassis sized to receive at least one component of said first device, at least a portion of said first chassis defining at least a portion of said first mounting pathway; and
a support spar being sized to be received by the first mounting pathwayy and being sized to engage said equipment cabinet, said support spar engaging the first mounting pathway and said equipment cabinet, said support spar extending substantially transversely between the first and second sides of said equipment cabinet to support said first device in said equipment cabinet, wherein said first chassis comprises a channel member therein, a top surface and a bottom surface, and wherein the first mounting pathway is defined by said channel member and the top surface of said first chassis so that when said support spar is received by the first mounting pathway, said support spar does not extend upwardly beyond the top surface of said first chassis.

3. A rank-mount storage system, comprising:
an equipment cabinet having a first side and a second side, said equipment cabinet defining at least one device opening therein;
a first device sized to be received by the device opening, said first device defining a first mounting pathway therein, said first device having first chassis sized to receive at least one component or said first device, at least a portion of said first chassis defining at least a portion of said first mounting pathway; and
a support spar being sized to be received by the first mounting pathway and being sized to engage said equipment cabinet, said support spar engaging the first mountang pathway and said equipment cabinet, said support spar extending substantially transversely between the first and second sides of said equiment cabinet to support said first device in said equiment cabinet, wherein said first device includes a fore-to-aft center of gravity location and wherein the first mounting pathway is located at about the fore-to-aft center of gravity location.

4. A rack-mount storage system, comprising:
an equipment cabinet having a first side and a second side, said equipment cabinet defining at least one device opening therein;
a first device sized to be received by the device opening, said first device defining a first mounting pathway therein, said first device having a first chassis sized to receive at least one component of said first device, at least a portion of said first chassis defining at least a portion of said first mounting pathway; and
a support spar being sized to be received by the first mounting pathway and being sized to engage said equipment cabinet, said support spar engaging the first mounting pathway and said equiment cabinent, said support spar extending substantially transversely between the first and second sides of said equiment cabinet to support said first device in said equiment cabinet, wherein said support spar includes a first end, a second end and a center, said support spar being curved such that the center of said support spar te higher than its first and second ends while said support spar is engaging the first mounting patnway and said equipment cabinet.

5. A rack-mount storage system, comprising:
an equipment cabinet having a first side and a second side, said equipment cabinet defining at least one device opening therein;
a first device sized to be received by the device opening, said first device defining a first mounting pathway therein, said first device having a first chassis sized to receive at least one component of said first device, at least a portion of said first chassis defining at least a portion of said first mounting pathway;
a support spar being sized to be received by the first mountng pathway and being sized to engage said equipment cabinet, said support spar engaging the first mounting pathway and said equipment cabinet, said support spar extending substantial transversely between the first and second sides of said equipment cabinet to support said first device in said equipment cabinet, wherein the device opening has a first side and a second side separated by a spaced distance and wherein said first device has a width that is less than the spaced distance between the first and second side of the device opening; and a spacer sleeve sized to be received over said support spar, said spacer sleeve extending between said first device and the second side of the device opening, said spacer sleeve holding said first device against the first side of the device opening.

6. A rack-mount storage system, comprising:

an eqipment cabinet having a first side and a second side, said equiment cabinet defining at least one device opening therein;

a first device sized to be received by the device opening, said first device defining a first mounting pathway therein, said first device having a first chassis sized to receive at least one component of said first device, at least a portion of said first chassis defining at least a portion of said first mounting pathway;

a support spar being sized to be received by the first mounting pathway and being sized to engage said equipment cabinet, said support spar engaging the first mounting pathway and said equipment cabinet, said support spar extending substantially transversely between the first and second sides of said equipment cabinet to support said first device in said equipment cabinet, wherein the device opening has a first side and a second side separated by a spaced distance and wherein said first device has a width that is less than the spaced distance between the first and second sides of the device opening; and a second device, said second device defining a second mounting pathway therein sized to receive said support spar, said second device having a second chassis sized to receive at teams one component of said second device, at least a portion of said second chassis defining at least a portion of said second mounting pathway said second device being mounted adjacent said first device so that said first and second devices extend between the first and second sides of the devices opening, wherein said first device is secured to said second device.

7. A rack-mount storage system, comprising:

an equipment cabinet having a first side and a second side, said equipment cabinet defining at least one device opening therein;

a first device sized to be received b the device opening, said first device having a chassis sized to receive at least one component of said first device, a portion of the chassis defining at least a portion of a first mounting pathway; and a support spar sized to be received by the first mounting pathway and to engage said equipment cabinet, said support spar engaging the first mounting pathway and said equipment cabinet, said support spar extending substantially transversely between the first and second sides of said equipment cabinet to support said first device in said equipment cabinet, wherein said first device includes a fore-to-aft center of gravity location and wherein said first mounting pathway is located at about the fore-to-aft center of gravity location.

8. A rack-mount storage system, comprising:

an equipment cabinet having a first side and a second side, said equipment cabinet defining at least one device opening therein;

a first device sized to be received by the device opening, said first device having a chassis sized to receive at least one component of said first device, a portion of the chassis defining at least a portion of a first mounting pathway; and a support spar sized to be received by the first mounting pathway and to engage said equiment cabinet, said support spar engaging the first mounting pathway and said equipment cabinet, said support spar extending substantially transversely between the first and second sides of said equipment cabinet to supuort said first device in said equipment cabinet, wherein the device opening defined by said equipment cabinet includes a first side and a second side separated by a spaced distance and wherein said first device has a width that is less than tne spaced distance between the first and second sides of said device opening, said rack-mount storage system further comprising a spacer sleeve sized to be received by said support spar, said spacer sleeve extending between said first device and the second side of the device opening, said spacer sleeve holding said first device against the first side of the device opening.

* * * * *

UNITED STATES PATENT AND TRADEMARK OFFICE
CERTIFICATE OF CORRECTION

PATENT NO.         : 7,255,234 B2
APPLICATION NO.    : 10/051573
DATED              : August 14, 2007
INVENTOR(S)        : Robert W Luffel et al.

It is certified that error appears in the above-identified patent and that said Letters Patent is hereby corrected as shown below:

In column 11, line 54, in Claim 2, delete "pathwayy" and insert -- pathway --, therefor.

In column 12, line 1, in Claim 3, delete "rank-mount" and insert -- rack-mount --, therefor.

In column 12, line 7, in Claim 3, after "having" insert -- a --.

In column 12, line 8, in Claim 3, delete "or" and insert -- of --, therefor.

In column 12, line 14, in Claim 3, delete "mountang" and insert -- mounting --, therefor.

In column 12, line 16, in Claim 3, delete "equiment" and insert -- equipment --, therefor.

In column 12, line 17, in Claim 3, delete "equiment" and insert -- equipment --, therefor.

In column 12, line 36, in Claim 4, delete "equiment cabinent" and insert -- equipment cabinet --, therefor.

In column 12, line 38, in Claim 4, delete "equiment" and insert -- equipment --, therefor.

In column 12, line 39, in Claim 4, delete "equiment" and insert -- equipment --, therefor.

In column 12, line 42, in Claim 4, delete "te" and insert -- is --, therefor.

In column 12, line 44, in Claim 4, delete "patnway" and insert -- pathway --, therefor.

In column 12, line 57, in Claim 5, delete "mountng" and insert -- mounting --, therefor.

In column 12, line 60, in Claim 5, delete "substantial" and insert -- substantially --, therefor.

In column 12, line 66, in Claim 5, delete "side" and insert -- sides --, therefor.

In column 13, line 7, in Claim 6, delete "eqipment" and insert -- equipment --, therefor.

In column 13, line 8, in Claim 6, delete "equiment" and insert -- equipment --, therefor.

In column 13, line 31, in Claim 6, delete "teams" and insert -- least --, therefor.

In column 13, line 33, in Claim 6, after "pathway" insert -- , --, therefor.

UNITED STATES PATENT AND TRADEMARK OFFICE
CERTIFICATE OF CORRECTION

PATENT NO. : 7,255,234 B2
APPLICATION NO. : 10/051573
DATED : August 14, 2007
INVENTOR(S) : Robert W Luffel et al.

It is certified that error appears in the above-identified patent and that said Letters Patent is hereby corrected as shown below:

In column 13, line 35, in Claim 6, delete "devices" and insert -- device --, therefor.

In column 13, line 42, in Claim 7, delete "b" and insert -- by --, therefor.

In column 14, line 26, in Claim 8, delete "equiment" and insert -- equipment --, therefor.

In column 14, line 30, in Claim 8, delete "supuort" and insert -- support --, therefor.

In column 14, line 35, in Claim 8, delete "tne" and insert -- the --, therefor.

Signed and Sealed this

Twelfth Day of August, 2008

JON W. DUDAS
*Director of the United States Patent and Trademark Office*